United States Patent [19]

Consoli

[11] 4,394,707
[45] Jul. 19, 1983

[54] ELECTRICAL CIRCUIT PACKAGE

[75] Inventor: John J. Consoli, Indianapolis, Ind.

[73] Assignee: Bell Telephone Laboratories, Incorporated, Murray Hill, N.J.

[21] Appl. No.: 238,470

[22] Filed: Feb. 26, 1981

[51] Int. Cl.³ .............................................. H05K 1/02
[52] U.S. Cl. ................................... 361/398; 361/395; 361/399
[58] Field of Search ...................... 339/17 F, 176 MF; 174/68.5; 361/380, 395–399, 417, 419, 420

[56] References Cited

U.S. PATENT DOCUMENTS

| | | | |
|---|---|---|---|
| 2,647,224 | 7/1953 | Bruck | 361/398 |
| 2,703,853 | 3/1955 | Chrystic | 361/398 |
| 2,892,131 | 6/1959 | Macdonnell | 361/398 |
| 3,615,006 | 10/1971 | Freed | 206/454 |
| 3,688,635 | 9/1972 | Fegen | 361/419 |
| 4,015,708 | 4/1977 | Kelm | 206/333 |
| 4,100,589 | 7/1978 | McGann | 361/399 |
| 4,160,503 | 7/1979 | Ohlbach | 206/328 |
| 4,226,491 | 10/1980 | Kazama et al. | 339/17 LM |

Primary Examiner—G. P. Tolin
Attorney, Agent, or Firm—H. L. Newman

[57] ABSTRACT

An electrical circuit package is disclosed that provides an electrically insulating protection cover for an integral circuit board assembly. The package includes a flexible dielectric substrate 10. A first portion 12 of the dielectric substrate has one or more electrically conductive paths 20 located thereon and one or more electrical components 30 supported thereon and electrically connected to the conductive paths. A second portion 14 of the dielectric substrate 10 is free of any paths or electrical components. The second portion is folded over and secured to the first portion to provide a protective enclosure.

3 Claims, 8 Drawing Figures

U.S. Patent     Jul. 19, 1983     4,394,707
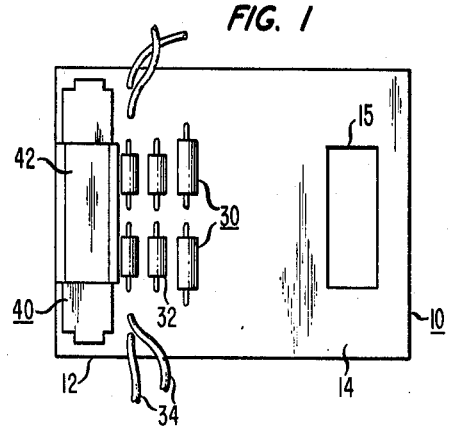
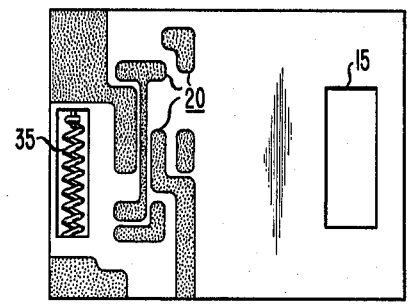
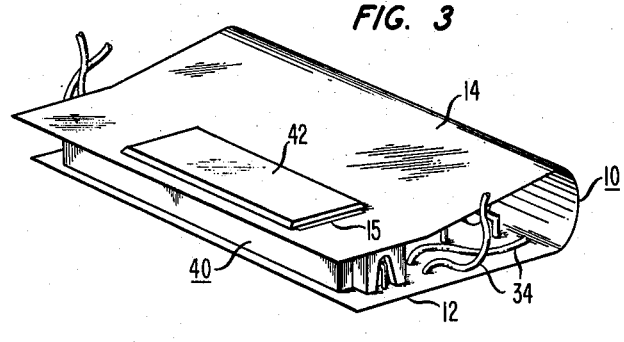
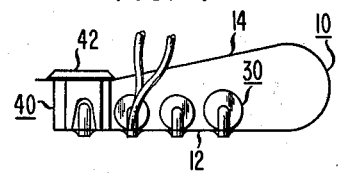
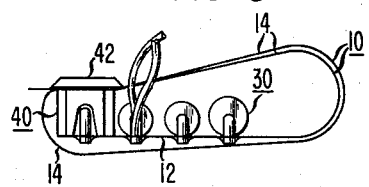
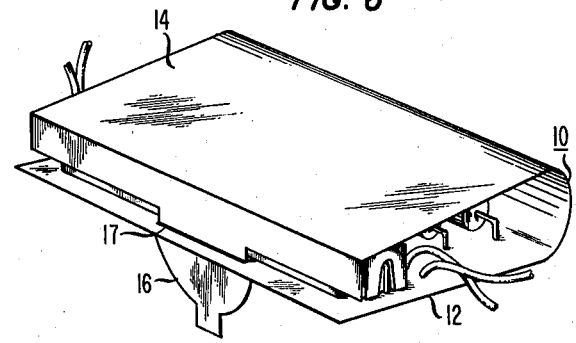
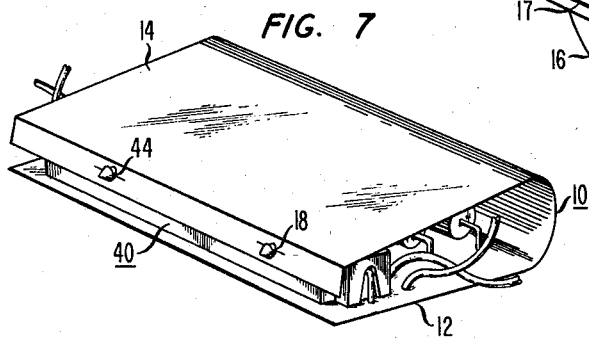
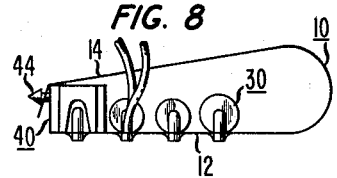

ELECTRICAL CIRCUIT PACKAGE

FIELD OF THE INVENTION

This invention relates to electrical circuit packages and within that field to electrically insulating protective packages.

BACKGROUND OF THE INVENTION

In the present day manufacture of electrical products, circuit boards are commonly used to interconnect and support electrical components. Such an arrangement provides a subassembly that is typically electrically connected to other electrical subassemblies of a product.

It is sometimes necessary to assemble these electrical subassemblies in close proximity to one another. A way must then be found to assure that the leads of the components mounted on the circuit board subassembly and/or the conductive paths on the circuit board do not make contact with the conductive paths or component leads of other subassemblies.

SUMMARY OF THE INVENTION

The solution in accordance with the present invention is an electrical circuit package that comprises a flexible dielectric substrate. A first portion of the dielectric substrate has one or more electrically conductive paths located thereon and one or more electrical components supported thereon and electrically connected to the conductive paths. A second portion of the dielectric substrate is free of any paths or electrical components. This second portion is folded over and secured to the first portion to provide an electrically insulating protective cover for the electrical components.

BRIEF DESCRIPTION OF THE DRAWINGS

FIGS. 1 and 2 are top and bottom views respectively of a first embodiment of the present invention showing the circuit package in its open condition;

FIG. 3 is a perspective view of the first embodiment showing it in its folded over and secured condition;

FIG. 4 is a side view of FIG. 3;

FIG. 5 is a side view of a variation of the first embodiment;

FIG. 6 is a perspective view of a second embodiment of the circuit package; and

FIGS. 7 and 8 are a perspective and side view respectively of a third embodiment of the circuit package.

DETAILED DESCRIPTION

Referring to FIGS. 1 and 2, a first embodiment of a circuit package in accordance with the present invention comprises a rectangular dielectrical substrate 10 formed from flexible sheet material such as reinforced woven epoxy resin. A first portion 12 at one end of the flexible substrate 10 has conductive paths 20 located on the underside thereof while a second portion 14, comprising the remainder of the substrate, is free of any conductive paths.

A plurality of electrical components 30 are positioned on the upper side of the first position 12 of the substrate 10. Lead wires of the components 30 extend through openings in the substrate 10 that are in alignment with the conductive paths 20, and the ends of the lead wires are electrically connected to the conductive paths by commercial techniques such as wave soldering.

While the electrical components 30 may comprise anything from relays to very large scale integrated circuits, the electrical components shown comprise discrete resistors 32, insulated lead wires 34, and a fuse 35 mounted in a fuse block 40. The lead wires 34 serve to connect the circuit assembly to other electrical components, while the fuse block 40 incorporates a catch for securing the first and second portions 12 and 14 of the substrate 10 together.

In this first embodiment, the catch comprises a rectangular cap 42 on the upper surface of the fuse block 40. The sides of the cap 42 are spaced closer together than the side surface of the fuse block 40. The front and rear of the cap 42, on the other end, extend beyond the front and rear surfaces of the fuse block 40 and are beveled at the top.

An opening 15 in the second portion 14 of the substrate 10 cooperates with the cap 42. The side edges of the opening 15 are spaced slightly farther apart than the sides of the cap 42, but the front and rear edges of the opening are spaced somewhat closer together than the front and rear ends of the cap.

As a result, the securing is achieved by first folding the second portion 14 of substrate 10 over the first portion 12 and positioning the opening 15 in alignment with the cap 42. Then by pressing down on the second portion 14 adjacent to the front and rear edges of the opening 15, the cap 42 is caused to move through the opening as shown in FIGS. 3 and 4. The front and rear ends of the cap 42 now overlie the second portion 14 adjacent to the front and rear edges of the opening 15 and thereby secure the second portion to the first portion 12.

It is seen that when the second portion 14 is so secured it provides an electrically insulating protective cover for the electrical components 30. Thus, the circuit package can be placed with the second portion 14 in direct contact with another electrical subassembly without causing an electrical short circuit between the subassemblies.

Furthermore, if it is desired to also provide an electrically insulating protective cover for the conductive paths 20 on the underside of the first portion 12 of the substrate 10, this is accomplished in the manner shown in FIG. 5. More specifically, the second portion 14 of the substrate 10 is made longer and the opening 15 is placed adjacent to the end of this longer second portion. In addition, a second opening (not shown) is provided that is situated between the first portion 12 and the opening 15 and is larger than the cap 42.

With this structural arrangement, the second portion 14 of the substrate 10 is first folded over the top of the first portion 12, placing the larger opening over the cap 42. The second portion 14 is then wrapped around the front of the fuse block 40, under the bottom of the first portion 12, and over itself to position the opening 15 in registration with the cap 42. The second portion 14 is secured in place in the same manner as described above.

In a second embodiment of the invention, shown in FIG. 6, the catch comprises an arrowheaded tab 16 on the end of the second portion 14 of the substrate 10, the tab being accommodated by a slot 17 in the end of the first portion 12. The slot 17 is smaller in width than the large end of the head of the tab 16, and thus when the head is pushed through the slot to the underside of the first portion 12, the second portion 14 is secured to the first portion.

Referring now to FIGS. 7 and 8, in a third embodiment of the invention the catch comprises a pair of spaced apart studs 44 extending from the front surface of the fuse block 40. The studs 44 have enlarged conically shaped heads which cooperate with a pair of comparably shaped circular openings 18 located adjacent to the end of the second portion 14 of the substrate portion 10. The openings 18 are smaller than the larger ends of the heads and orthogonal radial slits extend from the openings. Thus with the openings 18 positioned in alignment with the studs 44, the end of the portion 14 of the substrate 10 may be pressed against the front surface of the fuse block 40, causing the heads to move through the openings and secure the second portion in place as shown.

Although several embodiments of the invention have been shown and described, it should be understood that they are but illustrative and various modifications may be made without departing from the scope and spirit of this invention as defined in the appended claims.

What is claimed is:

1. An electrical circuit package comprising:
   a flexible dielectrical substrate;
   a single first portion of the dielectrical substrate having located thereon all electrically conductive paths and all electrical components associated with the circuit package, the components being electrically connected to the conductive paths on the first portion;
   at least one electrical component supported on the first portion of the substrate including an integral catch remote to the electrical connection of the component to the conductive paths on the first portion; and
   a single second portion of the dielectric substrate extending lengthwise from the first portion, the second portion being free of any electrically conductive paths and electrical components, the second portion having integral means for cooperating with the catch on the component to secure the two portions together, the second portion being at least equal in length to the first portion and being folded over and secured to the first portion to provide an electrically insulating protective cover for the components.

2. An electrical circuit package as in claim 1 wherein the catch comprises at least one protruding stud having an enlarged conically-shaped head at its end and the cooperating means of the second portion of the substrate comprises an opening that is smaller than the larger end of the conically-shaped head, the second portion including radial slits extending from the opening.

3. An electrical circuit package as in claim 1 wherein the catch comprises a rectangular cap located on the top surface of the electrical component, the cap having a pair of opposing edges spaced a particular distance apart, and the cooperating means of the second portion comprises an opening having a pair of corresponding opposed edges that are spaced somewhat closer together than the particular distance, the second portion adjacent to the opening being secured between the cap and the top surface of the component.

* * * * *